RADIO RECEIVING CIRCUIT

Filed Nov. 11, 1942 2 Sheets-Sheet 1

Inventor
Philip H. Greeley
By Leech + Radue
Attorneys

June 13, 1950 P. H. GREELEY 2,511,107

RADIO RECEIVING CIRCUIT

Filed Nov. 11, 1942 2 Sheets-Sheet 2

Inventor

Philip H. Greeley

By Leech + Radue

Attorneys

Patented June 13, 1950

2,511,107

UNITED STATES PATENT OFFICE 2,511,107

RADIO RECEIVING CIRCUIT

Philip H. Greeley, Washington, D. C.

Application November 11, 1942, Serial No. 465,250

6 Claims. (Cl. 250—20)

This invention relates to radio receiving circuits having oscillators tunable over a range of frequencies such as are commonly employed in the radio art and more particularly to oscillators and converter systems of the type used in superheterodyne radio receivers.

An object of this invention is to provide improved oscillator stability and evenness of performance over a tuning range or a plurality of tuning ranges and to effect this improved stability and evenness of performance in commonly employed oscillator circuits.

Another object is to provide means for eliminating or counteracting signal frequency degeneration in oscillator converter systems which is known to be detrimental to effective performance.

Another object is to provide means for reducing and controlling conversion frequency or intermediate frequency regeneration which commonly causes instability or wave form distortion in intermediate frequency amplifiers.

Still another object is to provide a two tuning band superheterodyne radio receiver circuit having a simplified band switching arrangement and eliminating switch contacts from the tuning circuits of one of said two tuning bands.

A further object is to provide converter system conditions which minimize audio frequency and cross-modulation effects of the intermediate frequency signal in the converter tube and system.

Additional objects and features of the present invention will appear from the specification and accompanying drawings.

Referring to the drawings:

Fig. 1 is a general equivalent schematic diagram of an oscillator circuit illustrating in essential form the principles and considerations affecting the oscillator design features of this invention;

Figs. 2*a*, 2*b*, and 2*c* are schematic diagrams of oscillator circuits familiar in the radio art and used herein for purposes of comparison and clarification;

Figs. 3*a*, 3*b*, and 3*c* are equivalent schematic diagrams of oscillator circuits used herein for further purposes of comparison and clarification;

*Means for oscillator control and stability*

As is well known, oscillators used in superheterodyne receivers give considerable trouble through frequency drift or frequency instability, particularly in the higher frequency wave bands and commonly toward the high frequency end of each tuning band where the tuning condenser is adjusted toward minimum capacity. Reasons for frequency drift are quite complex, but may be divided into two general classes (1) mechanical and material and (2) electronic or dynamic depending on valve or tube characteristics and operation.

Correction for frequency drift of type 1 is discussed elsewhere in the art and I shall herein consider the details of the circuit design I employ and the likely reasons for the greatly improved operational stability of the oscillators I have designed and constructed which have exhibited such exceptional stability and evenness of performance over a tuning range. For convenience in explanation, I find it helpful to employ a simplified or generalized oscillator equivalent diagram illustrated in Fig. 1 wherein a triode vacuum tube or equivalent having cathode K, grid G and plate P is shown having connection with a grid impedance $Z_{30}$, a plate impedance $Z_{50}$ and a common or mutual impedance $Z_{60}$. Interelement tube capacities are represented by $C_{GK}$, $C_{PK}$ and $C_{GP}$ or their respective reactances $-jX_{10}$, $-jX_{20}$ and $-jX_{70}$. A variable tuning condenser $C_T$ may be connected as shown and for convenience the reactance value of $C_T$ may be combined with the inductive reactances and resistances of such tuning coils as are included in $Z_{30}$ and $Z_{50}$ so that $Z_{30}$ and $Z_{50}$ actually represent the apparent impedances of grid and plate portions of the main tuning or tank circuit.

Regenerative feedback from plate to grid of the tube can occur only when the reactances or reactance components of the impedances are such as to give a phase reversal since a voltage *e* applied across grid to cathode elements appears as an equivalent plate circuit generator $-\mu e$ where "$\mu$" is the amplification constant of the tube. For oscillation, the reactive regenerative feedback must oppose and equal or exceed the degenerative circuit resistance or circuit resistance loading. Regenerative feedback is conveniently considered of two types, that due to "top coupling" which may be represented by a reactive element connected directly to tube grid and plate elements as $-jX_{70}$, Fig. 1, and that due to "bottom coupling" as represented by $Z_{60}$, Fig. 1, which may serve to indicate any coupling effect common to tube grid and plate circuits but not directly at grid or plate. "Bottom coupling" appears directly or effectively in the tube cathode connection or lead and must be a negative or capacitive type reactance to produce regeneration.

Figure 1:
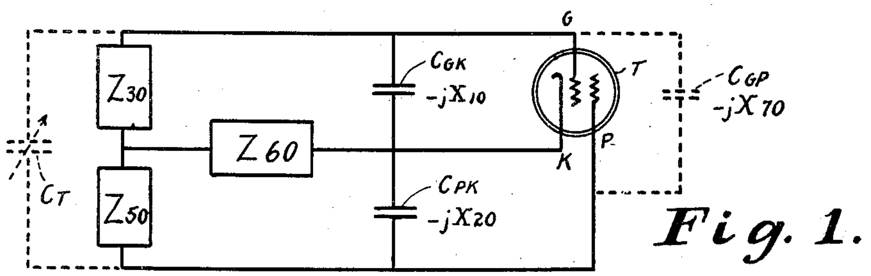
Figure 2A:
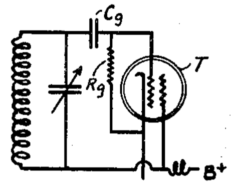
Fig. 2a. PRIOR ART
Figure 2B:
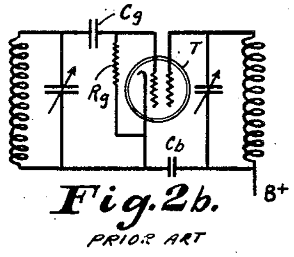
Fig. 2b. PRIOR ART
Figure 2C:
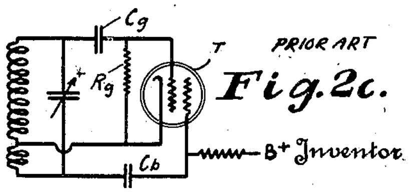
PRIOR ART Fig. 2c.

Familiar circuits may be reduced to the Fig. 1 equivalent as the Ultrandion circuit of Fig. 2*a* where regeneration occurs through top coupling, the GP reactance of the tuned circuit having a positive value and GK and PK reactances having a negative value because of tube capacities $C_{GK}$ and $C_{PK}$. The Colpitts circuit works in similar fashion. The tuned-grid, tuned plate oscillator of Fig. 2*b* also works because of top coupling where the GP reactance has a negative value and GK and PK reactances have a positive value because of their tuned circuits operating points. The Hartley circuit of Fig. 2*c* is an adaptable type of oscillator circuit and may operate in part through top coupling but more commonly is considered to operate mainly through the mutual reactance between the portions of the tapped tuning coil. This mutual reactance appears in $Z_{60}$, Fig. 1, as will be explained in connection with Fig. 3*c*. In the drawings, an electron discharge tube is designated by the letter T, said electron discharge tube being provided with a cathode K, a grid G, and such additional elements as are commonly employed as plate and screen elements. Also in the drawings, Figures 2*a*, 2*b* and 2*c* represent "prior art" in showing typical oscillator types for comparison purposes.

Figure 3A:
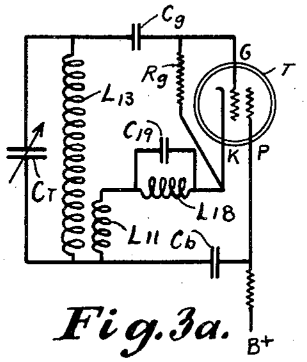

The circuit I may preferably employ incorporating the features of this invention is shown in Fig. 3*a*. Here a tuning coil $L_{13}$ and a parallel connected variable tuning condenser $C_T$ form a tank tuning circuit coupled to tube grid and plate elements G and P respectively through grid condenser $C_g$ and a direct current blocking condenser $C_b$ of suitable values. A magnetic feedback coil $L_{11}$ inductively coupled with $L_{13}$ is connected directly or through suitable coupling means to the plate end of the tank tuning circuit $L_{13}$, $C_T$, and through a series condenser $C_{19}$ to the tube cathode K. $C_{19}$ is made of such a value to equal and thereby neutralize the self inductance of feedback coil $L_{11}$ at the highest frequence in the tank circuit tuning range. A choke coil $L_{18}$ is connected directly or in effect in parallel with $C_{19}$ for the purpose of carrying tube cathode direct current and for other purposes hereinafter described. $L_{18}$ preferably is of a value to resonate with $C_{19}$ at a frequency below, or perhaps one-half, the lowest frequency in the tank circuit tuning range.

In order to clarify the effect of mutual reactances and locate the direction and effective position of said mutual reactances and other circuit elements, I prefer to reduce the circuit of Fig. 3*a* to an equivalent direct coupled circuit, following the reasoning set forth in the Circular of the Bureau of Standards, No. 74, page 56, #17 "Inductive coupling," and actually draw in the circuit diagram the mutual reactances as if they were real direct self-inductances. This practice is followed in drawing Fig. 3*b* as the direct coupled equivalent of the circuit of Fig. 3*a*. It will be observed that the tank coil of Fig. 3*b* is $$L_{13}-M_{13}+M_{13}$$

which is the exact equal of $L_{13}$, the tank coil of Fig. 3*a*. $L_{13}-M_{13}$ is the effective grid coil, $+M_{13}$ is the effective plate coil, and $L_{11}-M_{13}$ is the leakage inductance of $L_{11}$ which falls in the tube cathode lead and is common to tube grid and plate circuits. Fig. 3*c* shows the Hartley circuit of Fig. 2*c* re-drawn as an equivalent direct coupled circuit in the manner of Fig. 3*b* for purposes of comparison. In the circuit of Fig. 3*c*, the grid and plate coils $L_{23}$ and $L_{21}$ respectively have their total series inductance increased by 2M, the effective grid coil being $L_{23}+M_{23}$ and the effective plate coil being $L_{21}+M_{23}$, a negative mutual inductance $M_{23}$ appearing in the tube cathode lead making the plate coil from plate to cathode read $L_{21}+M_{23}-M_{23}$ which is correctly the equal of $L_{21}$ and similarly for the grid coil. This system of drawing in mutual reactances does not appear to be conventional practice but results in the same circuit analysis equations set up otherwise and seems to me preferable over trying to carry in mind the direction and effect of mutual reactances, particularly where added reactive elements are connected in series with mutual or leakage reactances.

Figure 4:
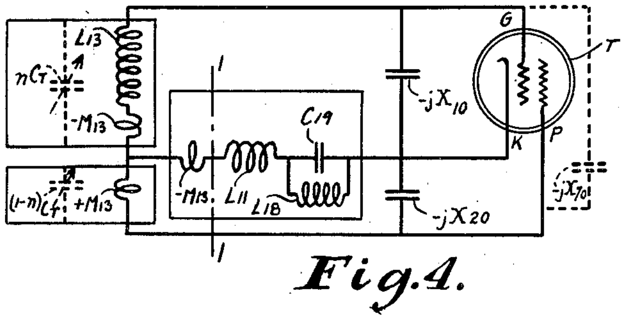
Fig. 4 is a particular equivalent schematic diagram related to Fig. 1 above and including features of this invention.
Figure 3B:
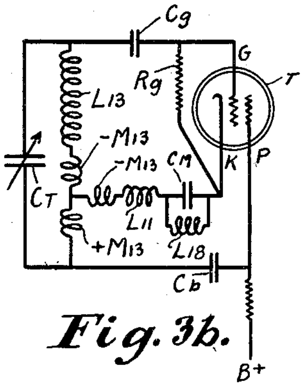
Figure 3C:
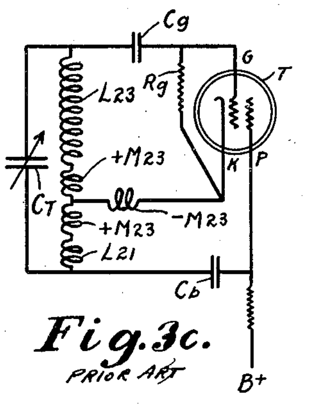
Fig. 3c. PRIOR ART

Fig. 4 is the equivalent of Fig. 3*b* re-drawn in the block diagram or generalized form of Fig. 1 and illustrates how the effective grid inductance $L_{13}-M_{13}$ may be considered as combined with the tuning condenser or effective part thereof $nC_T$ to form an apparent grid impedance as $Z_{30}$ of Fig. 1. Actually, the apparent grid impedance is given by $$\frac{(j\omega L_{13}-j\omega M_{13}+R_{13})\left(j\omega M-j\frac{1}{\omega C_T}\right)}{Z_0} \quad (1)$$

and the effective plate impedance as $Z_{50}$ of Fig. 1 is given by $$\frac{j\omega M\left(j\omega L_{13}-j\omega M_{13}-j\frac{1}{\omega C_T}+R_{13}\right)}{Z_0} \quad (2)$$

Where $R_{13}$ is the resistance of the tank coil $L_{13}$ and $Z_0$ is the total tank series impedance which is $$j\omega L_{13}-j\frac{1}{\omega C_T}+R_{13}=Z_0 \quad (3)$$

*Oscillator design and performance differences*

In designing an oscillator incorporating my improvements, I utilize the following approximate rules which will enable one skilled in the art to construct an oscillator having a materially changed operating point or condition from oscillators constructed along familiar and conventional lines and giving new and improved stability and evenness of performance over a tuning range as wide as is usually expected in variable tuned oscillators. Following the circuit illustrated in Fig. 3*a* and using any usual triode or suitable oscillator section of a multi-element tube as commonly employed in radio receivers and transmitters, I design the circuit components as follows:

The tank coil $L_{13}$ and tuning condenser $C_T$ are matched in accordance with conventional practice for an oscillator tuning range desired, as for example, 5 to 12 megacycles. The tank tuning coil should have a good "Q" value, or ratio of inductance reactance to resistance, preferably of 100 or better as is recommended for any oscillator expected to show good frequency stability and the maximum tuning capacity should preferably not exceed "Q" times the grid to cathode capacity of the tube. Since even small receiving tubes have a grid to cathode capacity (and often an equal grid to plate capacity) of about 3 to 4 $\mu\mu$fd. commonly employed tuning condensers up to 350 $\mu\mu$fd. are suitable. Larger tuning condensers, sometimes recommended for frequency stability purposes, may not operate satisfactorily with the circuit conditions I employ and I attain stability otherwise than through massed capacity as will be hereinafter explained.

With the tank tuning circuit designed, although the tank coil may be tapped, I prefer to use a separate feedback winding $L_{11}$ having a mutual inductive value with tank coil $L_{13}$ of about one-tenth the self-inductance value of $L_{13}$ and connect a condenser $C_{19}$ in series with $L_{11}$ as indicated in Fig. 3*a*. Moderately close coupling is preferably employed between $L_{11}$ and $L_{13}$ so that the self-inductance of $L_{11}$ is not unnecessarily large to give the desired mutual inductance ($M_{13}$ of Fig. 3*b*). With the resulting self-inductance of $L_{11}$ determined, $C_{19}$ is made of such a capacitive value to show series resonance or zero reactance with the reactance of $L_{11}$ at the highest frequency in the oscillator range, as for example, about 12 megacycles in an oscillator for a 5 to 12 meg. range. A choke $L_{18}$ is connected across $C_{19}$ and preferably may have relatively low resistance and an inductive value to resonate with $C_{19}$ at a lower frequency than the oscillator range, as for example, around 2.5 megacycles in a 5 to 12 meg. oscillator.

The oscillator circuit thus formed is in a general way similar to conventional Hartley oscillators and may be considered as a modified Hartley circuit, but the operating conditions are in a marked degree different from those employed in familiar Hartley circuits, particularly with reference to the maintenance of operating conditions over the frequency range of the tuning circuit. Hartley circuit analyses given in accepted radio text books commonly draw the conclusion that such a small effective plate coil (as $M_{13}$ of Fig. 3*b*) as I employ would not permit oscillation to be caused or maintained in the circuit. Such analyses for simplicity neglect the effect of inter-element tube capacities and indicate that an oscillator whose operating point and conditions are to a marked degree changed or affected by such relatively small tube inter-element capacities (aside from effect on frequency of oscillation) as is the case in oscillators of my design are not considered or thought of as useful.

In Hartley oscillators, and analyses thereof commonly set forth, the total series impedance of the oscillator tank circuit as $Z_0$ in (1), (2) and (3) above is considered, and without serious error, to have negligible or zero reactance at the oscillator operating frequency. But in the oscillator design I employ, $Z_0$ does not have zero reactance at the oscillator operating frequency but has a small but important excess tuning condenser reactance, which may be called $-jXd$, over the coil inductive reactance. This appreciable excess reactance $-jXd$ results from the fact that the effective tube grid coil is nearly the whole, perhaps 90 percent, of the total tank coil and the circuit is appreciably and importantly affected by the tube input capacity as $C_{GK}$ of Fig. 1 not only in determining the frequency of tuning but also in determining the controlling factors in circuit operation. With the circuit values I employ, approximately as set forth above, $-jXd$ may have a numerical value about equaling or exceeding the tank circuit resistance as $R_{13}$ in (3) above, and the apparent grid and plate impedances as $Z_{30}$ and $Z_{50}$ respectively in Fig. 1 by derivation from (1) and (2) above will be seen to have relatively high apparent inductive reactances. Where grid and plate impedances $Z_{30}$ and $Z_{50}$ have appreciable inductive reactance, regeneration through top coupling in the tube is considerable and greatly aids oscillation of the type discussed in connection with Fig. 5 and aids the relatively small bottom coupling.

A reasonable explanation of the improved operational frequency stability of my type oscillators observed in practice may be derived from considerations of parallel resonance or partial resonance as expressed in connection with the tube grid circuit particularly as set down in Formula 1 above. Plotting practical reactance and resistance values with respect to small changes in $-jXd$ relative to $R_{13}$ will give the usual reactance and resistance curves for a parallel circuit with the observation that from the point that $Xd$ is about zero to where $Xd$ numerically approaches the value of $R_{13}$, the resultant apparent reactance from Formula 1 rises steeply and from then on as $Xd$ exceeds $R_{13}$, the reactance changes very gradually. In employing circuit values that result in an operating point for the apparent grid circuit impedance $Z_{30}$ of Fig. 1, in an area of gradual change of effective reactance value, top coupling values through the tube do not tend to increase with or pull toward a slightly lower oscillating frequency. Usual circuits, in at least substantial portions of their tuning range, operate in the relatively unstable reactance area which may be indicated by saying $-jXd$ varies numerically from zero to about the value of the tank circuit resistance, and the effect of the relatively unstable top coupling through the tube is commonly minimized by employing a high value of tuning capacity relative to the tuning inductance.

Another reason for the observed frequency stability of my type oscillator exists in the unusual characteristics of the immediate oscillator grid circuit comprising $Z_{30}$, $-jX_{10}$ and $Z_{60}$ and the effect of tube grid conductance or grid resistance thereon. $C_{GK}$ having the reactance value of $-jX_{10}$ does, of course, complete the tuning of the tank circuit to resonance, but the apparent impedance $Z_{30}$ also rises to a sufficiently high value because of its inclusion of nearly the whole tank coil to meet the requirements of resonance with reactance $-jX_{10}$ in series with $Z_{60}$ which has relatively small value. This is a condition of apparent high resistance resonance whereby for example, $-jX_{10}$ may have a value of $-10{,}000j$ and $Z_{30}$ in parallel may have a value of $$+5000j+5000$$

and such a parallel circuit may be shown to result in a resistance value alone of 10,000. It may be shown that an added parallel resistance to such a resonant circuit as is substantially the effect of tube grid resistance does not affect the circuit resonant frequency. Usual circuits do not approach this resonant condition because the apparent impedance of $Z_{30}$ can only rise to a sufficient and suitable type of value under the conditions I employ where $Z_{30}$ contains nearly the whole tank tuning coil, tuning coil reactance to resistance ratios being limited as known in the radio art. Further in my type circuit, the tube grid resistance appears to have the effect of introducing a slight leakage into the capacitive tuning arm rather than adding resistance to the inductive tuning arm, thereby equalizing resistance in the two arms and improving stability. Also, the tube plate circuit contains in series an inductive type impedance $Z_{50}$ and a capacitive type reactance resulting from the nature of $Z_{60}$ which includes condenser $C_{19}$, Fig. 3b, and said tube plate circuit may be regarded as more or less reactance stabilized along lines somewhat equivalent to that described by Llewellyn, F. B., Proc. I. R. E., 19, 2063 (1931).

It will be seen therefore that I employ a circuit and circuit conditions giving an oscillator substantially if not completely different in important functions as compared to those hitherto known and described in the radio art, certainly, at least, with regard to oscillating circuits intended to maintain relatively even performance and frequency stability over a variable tuning range. The nature of the reactances I have included in $Z_{60}$ of Fig. 1 such as $-M_{13}$, $L_{11}$ and $C_{19}$ indicated in Fig. 4 and their total series reactance value varying inversely with frequency change in the oscillator tuning range serve to make the oscillator amplitude relatively even over said oscillator tuning range. Since by design, the reactance of condenser $C_{19}$ equals the inductive reactance of $L_{11}$ at the highest oscillator frequency, the cathode lead reactance to the right of line 1—1 of Fig. 4 increases from about zero to an appreciable negative value with decrease of oscillator frequency. This is to say that $Z_{60}$ of Fig. 1 which is a reactance or impedance common to tube grid and plate circuits and may be referred to conveniently as the feedback bottom coupling increases from a small or negligible value at high oscillator frequencies to a considerable value at low oscillator frequencies. In this way, regenerative feedback through bottom coupling increases the amplitude of oscillations at the lower frequencies and thereby compensates for the well known reduced feedback of the tube top coupling at the lower oscillation frequencies.

As a practical example of the evenness of amplitude output of my type oscillator, a 6V6 tube connected as a triode and operated at a plate voltage of 200 was tuned over a range from 6 megacycles down to 2.7 megacycles with readings taken on oscillator peak volts output between tube plate and cathode: said peak volts increased gradually from 42 to 60 at mid frequency range and decreased again to 42 at the low frequency end of range. This is an amplitude variation of less than 1.5 to 1 which is a considerable improvement over the 2 to 1 variation in amplitude of output expected of usual oscillators. The relatively large amplitude of the oscillator output even with the relatively small effective plate coil employed in my design demonstrates clearly the substantial value of other circuit conditions I employ and have described hereinbefore.

Insofar as the usual Hartley circuit operates through bottom coupling such as that caused by $-M_{23}$ of Fig. 3c becoming the equivalent of $Z_{60}$ of Fig. 1, it will be observed that the reactance value of $-M_{23}$ increases with frequency and such an oscillator has a falling amplitude of output with decrease of frequency. It appears that usual Hartley oscillators operate mainly through bottom coupling feedback which necessarily is made of considerable value in order to maintain oscillation at lower tuning ranges.

It is important to note that the bottom coupling I employ which is represented in $Z_{60}$ of Fig. 1 must be designed within certain limitations to be effective although values are not critical. $Z_{60}$ should be made to have reactance value without considerable resistance because effective resistance in $Z_{60}$ becomes a resistance common to tube grid and plate circuits and such resistances causes degeneration and would have to be overcome by increased regenerative feedback. It is generally impractical to by-pass condenser $C_{19}$ in the equivalent of $Z_{60}$ in Fig. 4, by a resistor for the purpose of carrying tube cathode current because a resistor of low enough value to prevent excessive oscillator grid bias would introduce a detrimental equivalent series resistance into $Z_{60}$. The choke $L_{18}$ here employed should have a sufficient inductive value to resonate with $C_{19}$ appreciably below the lowest oscillator frequency to avoid introduction of appreciable resistance which is shown by the parallel circuit formed by $L_{18}$ and $C_{19}$ at and near parallel resonance. $C_{19}$ is not merely a bypass condenser but is a circuit reactive element whose value must be selected within relatively small limits to accomplish the purposes hereinbefore set forth.

The control of feedback maintaining oscillation in a circuit is of importance in any oscillator desirable for use. Top coupling as exhibited in the old but seldom used circuits typified in Figs. 2a and 2b is difficult to control satisfactorily, but such top coupling as is useful in my type oscillator is readily controlled in magnitude by minor change in the value of the effective plate coil as $+M_{13}$ of Fig. 3b and the bottom coupling is readily controlled by the design of circuit elements which can be considered to fall in $Z_{60}$ of Fig. 1. A complete analysis of the circuit I employ becomes extremely complex when every circuit element including at least two of the tube inter-element capacities must be considered important and not to be neglected and since the total feedback producing oscillation is the summation of types of feedback ordinarily treated separately. For this reason and to indicate clearly the oscillator design considerations I employ, I have for analysis broken the circuit into sections and combined the impedance elements in each section into apparent impedances representing the circuit functioning of each of said sections. This method appears to be legitimate and useful and agrees with observed performance.

It may be said that the circuit and proportioning of elements of this invention are characterized by an effective tube grid coil that differs in small degree of magnitude with the total tank tuning coil or a near approach to identity in combination with a reactance element common to tube grid and plate circuits having a negative or capacitive type of value which varies inversely with frequency and serves to maintain total oscillator feedback at a suitable value over the oscillator tuning range. It will be understood that the frequency range of operation and different tube types having different inter-element capacities or equivalent make possible some design changes, but substantial inclusion of the main design features herein set forth appears necessary to obtain the unusual and improved oscillator performance hereinbefore set forth. It may be practicable to in effect interchange tube grid and plate circuits so far as their proportions are concerned as may be done with the conventional Hartley oscillator without altering the major features of this invention.

*Frequency conversion system*

Figure 5:
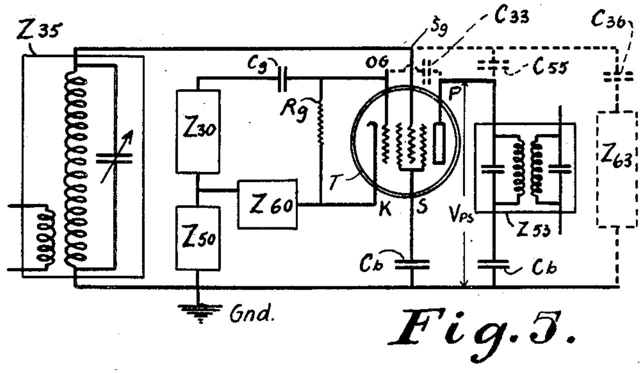
Fig. 5 is a schematic equivalent circuit diagram for an oscillator converter system incorporating the features of this invention and illustrating design considerations.

An application of an oscillator incorporating the features of this invention to a frequency conversion system of a common type is illustrated in Fig. 5. Here the oscillator is the triode section of a pentagrid converter tube which may be of a familiar type known as the 6SA7, though equivalent oscillator-converter or separate oscillator and converter tubes may be employed. In Fig. 5, $Z_{30}$, $Z_{50}$ and $Z_{60}$ together with tube oscillator grid OG, cathode K, and oscillator plate and screen S represent the circuit of Fig. 3*a* drawn in the form of Fig. 1. $Z_{35}$ represents a signal input tuning circuit which may be coupled with any suitable signal source and is connected to the tube signal grid $S_g$ and through impedances $Z_{50}$ and $Z_{60}$ with the tube cathode K. The tube conversion output circuit from plate P to cathode K includes the primary of a conversion or intermediate frequency transformer $Z_{53}$ tuned to a fixed frequency relatively low, in usual practice, to any frequencies in the oscillator and signal tuning bands. Small inter-element tube capacities such as the important P to $S_g$ condenser $C_{55}$, the less important P to OG condenser $C_{33}$ and a generalized capacity or condenser $C_{36}$ coupling $S_g$ to any source of amplified intermediate frequency voltage such as may be present at a terminal of a later stage intermediate amplifier transformer $Z_{63}$ are indicated in Fig. 5. Condensers $C_b$ are by-pass type without other importance, $C_g$ is a grid condenser and $R_g$ a grid leak resistance.

Now a well known difficulty in superheterodyne receivers is the signal frequency degeneration caused by feedback in opposition to the applied signal from the tube plate circuit or tube plate through the small capacity $C_{55}$ between signal grid and plate when the tube plate circuit shows a capacitive reactance which is shown by $Z_{53}$ tuned to a lower than signal frequency. With ground $G_{nd}$, Fig. 5, as a reference the developed signal voltage at the tube plate may be represented by $V_{ps}$ and a portion of $V_{ps}$ will appear across $Z_{35}$ in accordance with the tuned resistance or impedance value of $Z_{35}$ with respect to the reactance value of coupling capacity $C_{55}$. Now it will be observed that a portion of voltage $V_{ps}$ also appears between tube cathode K and ground in accordance with the impedance value of $Z_{60}$ and $Z_{50}$ in series with respect to the tube plate resistance $R_p$. If the cathode signal feedback voltage and the signal grid feedback voltage can be made about equal and opposite in direction, it will be obvious that a cancellation of feedback voltage will be effected between tube signal grid SG and cathode K and the tube will operate as if there were no feedback. In order to provide a regenerative bottom coupling to counteract the degenerative top coupling through capacity $C_{55}$, $Z_{50}$ and $Z_{60}$ should present a relatively small negative or capacitive type of total series reactance which can be provided in the design of $Z_{50}$ and $Z_{60}$ without serious departure from the values indicated for best performance of the oscillator section of the tube. Design considerations are somewhat complex, but values are not particularly critical in that a small amount of signal regeneration or degeneration is tolerable without serious adverse effect on receiver performance. But it is of great importance to be able readily to reduce a serious amount of signal degeneration so that signal conversion strength or amplitude is good.

It has been found in practice that the arrangement outlined in Fig. 5 incorporating the oscillator features of this invention results in greatly improved conversion performance over comparable oscillator-converter systems, particularly in the higher frequency ranges as above 3 megacycles. In part, there is an initial advantage in that the effective oscillator plate coil in $Z_{50}$ is smaller than the equivalent coil in a comparable Hartley oscillator, and the reactance at signal frequency, off resonance of the oscillator frequency, is relatively small. This fact facilitates the designing of $Z_{60}$ so that $Z_{50}$ and $Z_{60}$ in series show a suitable reactance value to regenerate the signal frequency in the converter tube to overcome the otherwise degenerative feedback through capacity $C_{55}$. It will be understood that a suitably designed impedance element comprising a condenser $C_{19}$ and choke $L_{18}$ (Fig. 4) designed only for the purpose of counteracting signal frequency degeneration may be used for a converter tube input where a separate oscillator is employed or for oscillator-converter tubes adapted for different external circuits.

Conversion systems are of wide variety and design considerations vary accordingly, but signal frequency degeneration is commonly a difficulty which may be conveniently overcome by the means and arrangement hereinbefore described. The useful and effective frequency operating range of some desirable tube types such as the familiar type 6SA7 is considerably extended by the use of features and design considerations described in connection with Fig. 5.

Another well known difficulty in superheterodyne receivers is the conversion or intermediate frequency regeneration set up where the tube plate circuit contains a transformer or other circuit tuned to intermediate frequency resonance as $Z_{53}$, Fig. 5, and where the tube grid circuit has a signal tuning element tuned to a higher than intermediate frequency as $Z_{35}$, and a small coupling capacity $C_{55}$ is present between tube grid and plate elements. At the intermediate frequency, below the resonant signal tuning frequency of $Z_{35}$, $Z_{35}$ shows inductive reactance and the feedback through $C_{55}$ is regenerative. The magnitude of the voltage fed back and causing intermediate frequency, or I. F., regeneration is proportional to the reactance of $Z_{35}$ and the reactances of $Z_{35}$ and $C_{55}$ in series with respect to the I. F. Now, this I. F. regenerative feedback may be counteracted by a suitable degenerative feedback through tube bottom coupling which may be controlled by the design of common or cathode lead impedance such as that formed by $Z_{50}$ and $Z_{60}$, Fig. 5, in series with respect to the I. F. If the plate circuit of the tube, Fig. 5, alone is considered, $Z_{50}$ and $Z_{60}$ should be designed to show an apparent small resistance at the I. F., in which case the degenerative feedback magnitude is proportional to the I. F. resistance value of $Z_{50}$ and $Z_{60}$ divided by the tube plate resistance approximately. However, in some pentagrid converter tubes, such as the type 6SA7, the screen current is considerably larger than the plate current and the screen current has the effect of causing I. F. degeneration when the common or cathode lead impedance formed as by $Z_{50}$ and $Z_{60}$, Fig. 5, shows positive or inductive reactance at the I. F. In this case, with an effective inductive reactance in the tube cathode lead, the tube elements K, $S_g$ and S, with associated circuit elements, may be viewed as forming the reverse of an oscillator circuit in that the feedback is against oscillation.

It will be observed that the degenerative feedback of the I. F. desirable in most cases should be small or should result from relatively small values of impedance in the tube cathode or lead common to tube grid and plate or screen circuits. The impedance value in the cathode or common lead is readily controlled by the design of the small impedance elements such as that formed by condenser $C_{19}$ and choke $L_{18}$, Fig. 4, which form a part of $Z_{60}$, Fig. 5. Since the value of $C_{19}$ is determined with respect to performance of the circuit at oscillator or signal frequencies, the inductance value of $L_{18}$ is determined with respect to the desired parallel impedance value at the I. F. That is, $C_{19}$ with $L_{18}$ is made to resonate at a frequency higher than the I. F. and lower than signal and oscillator frequencies whereby the impedance element formed by $C_{19}$ with $L_{18}$ is seen to show condenser reactance at signal and oscillator frequencies and change over to show inductive reactance or impedance at the I. F. This changeover is of great importance since a negative or capacitive type reactance desired for improved oscillator and signal frequency performance must be eliminated with reference to the I. F. or otherwise highly regenerative I. F. effects would be produced in addition to the I. F. regeneration difficulty already present in usual circuits through top coupling as through condenser $C_{55}$.

Figure 6:
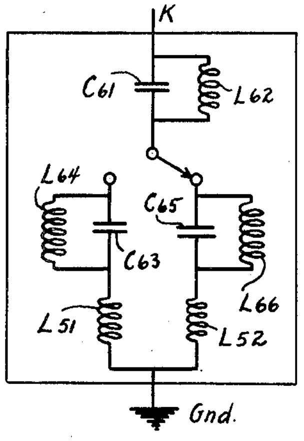
Fig. 6 is a simplified schematic diagram for circuit elements of this invention and switching means for the same.

In practical form, small impedance control elements such as that formed by $C_{19}$ and $L_{18}$ may be miniature type formed by a small mica condenser of convenient "postage stamp" type and a small diameter solenoid coil mounted thereon forming $L_{18}$. In some cases, as for example where a signal frequency differs from the I. F. by relatively small degree, it may be difficult to design a single impedance control element to show desired reactance and changeover characteristics with respect to signal, oscillator and intermediate frequencies. In which case, suitable characteristics may be provided by the use of a pair of impedance control elements operative in series as indicated in Fig. 6. In Fig. 6, showing only a tube cathode K to ground G*nd* circuit, $L_{51}$ and $L_{52}$ are oscillator feedback coils for different frequency ranges, each similar to $L_{11}$ of Fig. 3*a*, and $L_{64}$ with $C_{63}$, $L_{66}$ with $C_{65}$, and $L_{62}$ with $C_{61}$, are impedance control elements, each similar to that formed by $L_{18}$ and $C_{19}$ of Fig. 3*a*. By employing different condenser and choke values in said impedance control elements, any pair in series may be made to show desired characteristics with respect to the three operating frequencies involved.

The practical value of eliminating serious I. F. regeneration in the converter or oscillator-converter tube results in improved I. F. amplifier performance in lessening wave form distortion and tendency toward instability through regenerative effects. In an I. F. amplifier having large voltage gain, regeneration is largely a cumulative matter, and where the commonly predominant regeneration in the converter tube is substantially eliminated as hereinbefore set forth, there is relatively little difficulty introduced by regeneration from a later stage I. F. circuit as indicated by capacitive coupling $C_{36}$ between the tube grid $S_g$ and a later stage I. F. circuit $Z_{63}$, Fig. 5. Such later stage feedback or over-all regeneration may be difficult to visualize or estimate with any accuracy as to magnitude and phase, yet practical results indicate that such over-all feedback is not likely to present serious trouble where the converter stage is stabilized and not already in an appreciably regenerative condition. An I. F. stabilized converter permits reduction or elimination of I. F. amplifier tube shielding and other construction difficulties. Although an un-by-passed cathode resistor is sometimes used in a single I. F. amplifier stage to make said stage degenerative, it appears of relatively greater importance to stabilize the converter stage as hereinbefore described and where an inductive impedance appears to operate more effectively than a plain resistor without a by-pass condenser.

Figure 7:
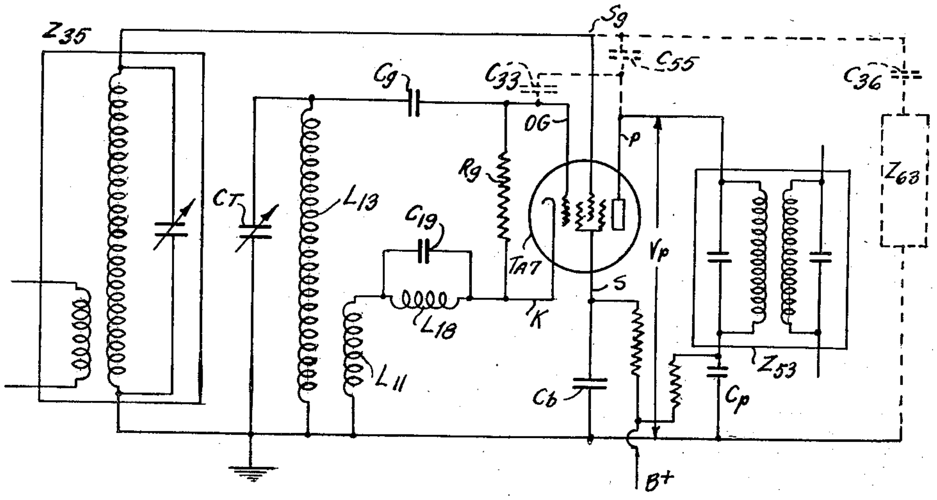
Fig. 7 is a schematic diagram of the oscillator of Fig. 3*a* employed in a pentagrid oscillator-converter system of the type shown in simplified schematic form in Fig. 5.

In Fig. 7 the oscillator of Fig. 3*a* is shown combined in a pentagrid oscillator-converter system such as commonly used in many superheterodyne radio circuits with a full disclosure of all of the essential elements of both circuits. The numbering in this figure follows that in Figs. 3*a* and 5. No special discussion of this figure is believed necessary other than to point out that the screen S serves as the oscillator plate, is bypassed to ground through capacitor $C_b$ and supplied with current from B+ through a resistor, while the conversion frequency plate P circuit of the tube $T_{a7}$ is coupled through a conversion frequency transformer $Z_{53}$ to a suitable amplifier and supplied with current through a resistor from B+ with a suitable by-pass condenser $C_p$.

Where the parallel circuit $C_{19}$—$L_{18}$ is tuned to a frequency lower than oscillator and signal frequencies, the cathode to ground circuit of the tube is capacitive with respect to these higher frequencies with an important improvement in oscillator performance and with an increase of input without serious risk of signal frequency instability. As a particular example the conversion frequency may be 455 kc., the signal frequency 5 mc. and the oscillator frequency 5.455 mc., in which case the parallel circuit $C_{19}$—$L_{18}$ may be tuned to about 2 mc.

The impedance control elements hereinbefore described are not particularly critical in design and construction to accomplish the circuit effects desired in a substantial and effective way. Greatly improved receiver performance in the direction of stability and evenness of performance is accomplished, however, by the use of said impedance control elements and their resulting effect on circuit performance with respect to the three important frequency considerations involved in oscillator-converter systems such as are employed in superheterodyne radio receivers and the like.

What I claim is:

1. In a variable frequency oscillator comprising an electron tube having cathode, grid and plate elements, a tuning coil and condenser circuit coupled between tube grid and plate elements, means for controlling oscillator feedback with respect to frequency which comprises reactance elements in tube grid-plate circuit, a cathode to grid-plate circuit including in series, a feedback coil in mutual inductive relationship with said tuning coil, a capacitive element of predetermined value providing reactance substantially equal to the inductive reactance value of said feedback coil at a high frequency in the oscillator tuning range; and means so related to the series circuit and having such reactance as to maintain therein a high reactance ratio at oscillator frequencies.

2. In a variable frequency oscillator comprising an electron tube having cathode, grid and plate elements, a tuning coil and condenser circuit, means connecting at least a section of said circuit between the tube grid and plate elements, means for controlling oscillator feedback with respect to oscillation frequency which comprises reactance elements in tube grid and plate circuits for changing the reactance thereof and including in series, in the plate-cathode circuit a feedback coil in mutual inductive relationship with said tuning coil, a capacitive element of such predetermined value as to provide reactance substantially equal to the inductive reactance value of said feedback coil at a high frequency in the oscillator tuning range, and means for completing the tube cathode circuit for direct current, said means being arranged to maintain in said cathode circuit a high reactance to resistance ratio at oscillator frequencies.

3. In an oscillator tunable over a range of frequencies, an electron discharge tube having a cathode, a grid and an anode, a tuning coil and condenser circuit coupled across said tube grid and anode, and a cathode lead circuit having predetermined reactance characteristics connected between said tube cathode and anode and comprising, in series, a feedback coil having inductive relation with said tuning coil and a condenser having a reactance value substantially equaling and canceling the self-inductive reactance of said feedback coil at the highest frequency in the oscillator range, and means for supplying tube cathode current around said last mentioned condenser and designed to substantially maintain said predetermined reactance characteristics of the said cathode lead circuit at oscillator frequencies.

4. In an oscillator-converter system, an electron discharge tube having a signal input element, a conversion frequency output element, and an oscillator section comprising a cathode, a grid and an anode, an oscillator circuit tunable over a range of frequencies comprising a tuning coil and condenser circuit coupled across said tube grid and anode, and a cathode lead circuit having predetermined reactance characteristics connected between said tube cathode and anode and comprising, in series, a feedback coil inductively related to said tuning coil and a condenser having a reactance value substantially equaling and canceling the self-inductive reactance of said feedback coil at the highest frequency in the oscillator range, and means for supplying tube cathode current around said last mentioned condenser and substantially maintaining said predetermined reactance characteristics of the cathode lead circuit at oscillator frequencies.

5. In an oscillator-converter system, an electron discharge tube having a signal input element, a conversion frequency output element, and an oscillator section comprising a cathode, a grid and an anode; an oscillator circuit tunable over a range of frequencies and comprising a tuning coil and condenser circuit, means connecting said circuit to said tube grid and anode; and a cathode lead circuit having predetermined reactance characteristics capable of causing oscillation connected between said tube cathode and anode and comprising a feedback coil arranged to have inductive relation with said tuning coil, a series condenser having a reactance value substantially equaling and canceling the self-inductive reactance of said feedback coil at the highest frequency in the oscillator range, and a choke coil connected across said series condenser having a self-inductive reactance substantially higher at oscillator and signal frequencies and lower at the conversion frequency than the capacitive reactance of said series condenser.

6. A variable frequency oscillation generator tunable over a range of frequencies comprising a vacuum tube oscillator having grid, anode and cathode elements with inherent capacitance effects between said elements, a tuned circuit having a main tuning capacitor and main inductance coil coupled between grid and anode elements of the vacuum tube oscillator, and a feedback circuit of predetermined design including in series a capacitive element and a feedback coil inductively coupled with the main inductive coil, said feedback circuit having a predominantly capacitive reactance and minimum resistance over the oscillator range of frequencies and being coupled between cathode and anode elements of said oscillator tube.

PHILIP H. GREELEY.

REFERENCES CITED

The following references are of record in the file of this patent:

UNITED STATES PATENTS

| Number | Name | Date |
|---|---|---|
| 2,038,879 | Williams | Apr. 28, 1936 |
| 2,049,777 | Mountjoy | Aug. 4, 1936 |
| 2,058,260 | Reinartz | Oct. 20, 1936 |
| 2,061,416 | Blume | Nov. 17, 1936 |
| 2,066,038 | Herold | Dec. 29, 1936 |
| 2,111,764 | Foster | Mar. 22, 1938 |
| 2,115,858 | Keall | May 3, 1938 |
| 2,125,719 | Harries | Aug. 2, 1938 |
| 2,200,498 | Haantjes et al. | May 14, 1940 |
| 2,236,004 | Mac Lean | Mar. 25, 1941 |
| 2,246,696 | Reid | June 24, 1941 |
| 2,253,853 | Haantjes et al. | Aug. 26, 1941 |
| 2,256,931 | Wolfskill | Sept. 23, 1941 |
| 2,260,844 | Thomas | Oct. 28, 1941 |
| 2,273,640 | Haantjes et al. | Feb. 17, 1942 |
| 2,275,452 | Meacham | Mar. 10, 1942 |
| 2,285,030 | Haantjes et al. | June 2, 1942 |
| 2,305,262 | Lange | Dec. 15, 1942 |
| 2,309,031 | Worchester, Jr. | Jan. 19, 1943 |